United States Patent
Ikehashi (10) Patent No.: US 10,892,732 B2
(45) Date of Patent: Jan. 12, 2021

(54) RESONATOR AND DEVICE INCLUDING THE SAME

(71) Applicant: KABUSHIKI KAISHA TOSHIBA, Tokyo (JP)

(72) Inventor: Tamio Ikehashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 16/352,240

(22) Filed: Mar. 13, 2019

(65) Prior Publication Data
US 2020/0067479 A1   Feb. 27, 2020

(30) Foreign Application Priority Data

Aug. 27, 2018   (JP) .................................. 2018-158389

(51) Int. Cl.
| | |
|---|---|
| *H03H 9/02* | (2006.01) |
| *H03H 9/24* | (2006.01) |
| *H03H 9/10* | (2006.01) |
| *G01C 19/5712* | (2012.01) |

(52) U.S. Cl.
CPC .... *H03H 9/02433* (2013.01); *H03H 9/02338* (2013.01); *H03H 9/1057* (2013.01); *H03H 9/2436* (2013.01); *G01C 19/5712* (2013.01); *H03H 2009/0244* (2013.01)

(58) Field of Classification Search
CPC ........... H03H 9/02433; H03H 9/02338; H03H 9/1057; H03H 9/0236
USPC ....................................................... 310/309
See application file for complete search history.

(56) References Cited

U.S. PATENT DOCUMENTS

| | | | | |
|---|---|---|---|---|
| 4,668,928 A | * | 5/1987 | Davis ................. | H01H 51/2227 335/234 |
| 4,943,750 A | * | 7/1990 | Howe .................... | H02N 1/004 310/309 |
| 5,461,272 A | * | 10/1995 | Matsumoto ............ | H02N 1/004 310/12.03 |
| 6,949,866 B2 | * | 9/2005 | Miller ................. | B81C 1/00968 310/309 |
| 7,030,537 B2 | * | 4/2006 | Staple ................... | B81B 3/0008 310/309 |
| 7,119,474 B2 | * | 10/2006 | Miller ................. | B81C 1/00968 310/311 |

(Continued)

FOREIGN PATENT DOCUMENTS

| | | |
|---|---|---|
| JP | 2005-527783 A | 9/2005 |
| JP | 2009-272757 A | 11/2009 |

(Continued)

OTHER PUBLICATIONS

Vatanparvar, D., et al., "Effect of Fabrication Imperfections on Energy Loss through Mechanical Mode Coupling in MEMS," 5th IEEE International Symposium on Inertial Sensors & Systems (INERTIAL), pp. 171-172 (Mar. 26-29, 2018).

*Primary Examiner* — Terrance L Kenerly
(74) *Attorney, Agent, or Firm* — Finnegan, Henderson, Farabow, Garrett & Dunner, L.L.P.

(57) ABSTRACT

According to one embodiment, a resonator is disclosed. The resonator includes a vibrator and an attenuation mechanism. The attenuation mechanism selectively attenuates vibration of a spurious mode that is mechanically coupled to a first mode when the vibrator vibrates in the first mode.

20 Claims, 9 Drawing Sheets

(56) References Cited

U.S. PATENT DOCUMENTS

| | | | |
|---|---|---|---|
| 7,420,729 B2* | 9/2008 | Mochizuki | G02B 6/3556 |
| | | | 359/212.1 |
| 9,634,227 B1 | 4/2017 | Thalmayr et al. | |
| 2003/0101814 A1 | 6/2003 | Challoner et al. | |
| 2004/0245889 A1* | 12/2004 | Miller | H02N 1/002 |
| | | | 310/309 |
| 2005/0269898 A1* | 12/2005 | Miller | B81C 1/00968 |
| | | | 310/309 |
| 2007/0119258 A1 | 5/2007 | Yee | |
| 2010/0327992 A1 | 12/2010 | Suzuki | |
| 2016/0087550 A1 | 3/2016 | Nagata et al. | |
| 2016/0118955 A1 | 4/2016 | Hsu et al. | |
| 2017/0126206 A1 | 5/2017 | Nguyen et al. | |
| 2018/0143020 A1 | 5/2018 | Hatakeyama et al. | |

FOREIGN PATENT DOCUMENTS

| | | |
|---|---|---|
| JP | 2016-63521 A | 4/2016 |
| JP | 2017-533646 A | 11/2017 |
| JP | 2018-84442 A | 5/2018 |

* cited by examiner

RESONATOR AND DEVICE INCLUDING THE SAME

CROSS-REFERENCE TO RELATED APPLICATIONS

This application is based upon and claims the benefit of priority from Japanese Patent Application No. 2018-158389, filed Aug. 27, 2018, the entire contents of which are incorporated herein by reference.

FIELD

Embodiments described herein relate generally to a resonator and a device including the same.

BACKGROUND

A MEMS resonator is known as one of devices formed by using MEMS technology. A MEMS resonator using a disk-shaped vibrator has high symmetry so that it is suitable for a direct angle detect type gyroscope. A vibrator having an opening at the center thereof (doughnut shaped vibrator) can be hold on a substrate by using a single anchor part and spring portions.

However, the MEMS resonator using the doughnut shaped vibrator and the single anchor part easily generates a vibration of a spurious mode (unnecessary vibration that is different from the original vibration of the resonator) in addition to a vibration of a main mode used for gyro operation. When the spurious mode is generated, Q factor of the vibration of the main mode is reduced.

DETAILED DESCRIPTION

In general, according to one embodiment, a resonator is disclosed. The resonator includes a vibrator and an attenuation mechanism. The attenuation mechanism selectively attenuates vibration of a spurious mode mechanically that is coupled to a first mode when the vibrator vibrates in the first mode.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

Figure 1:
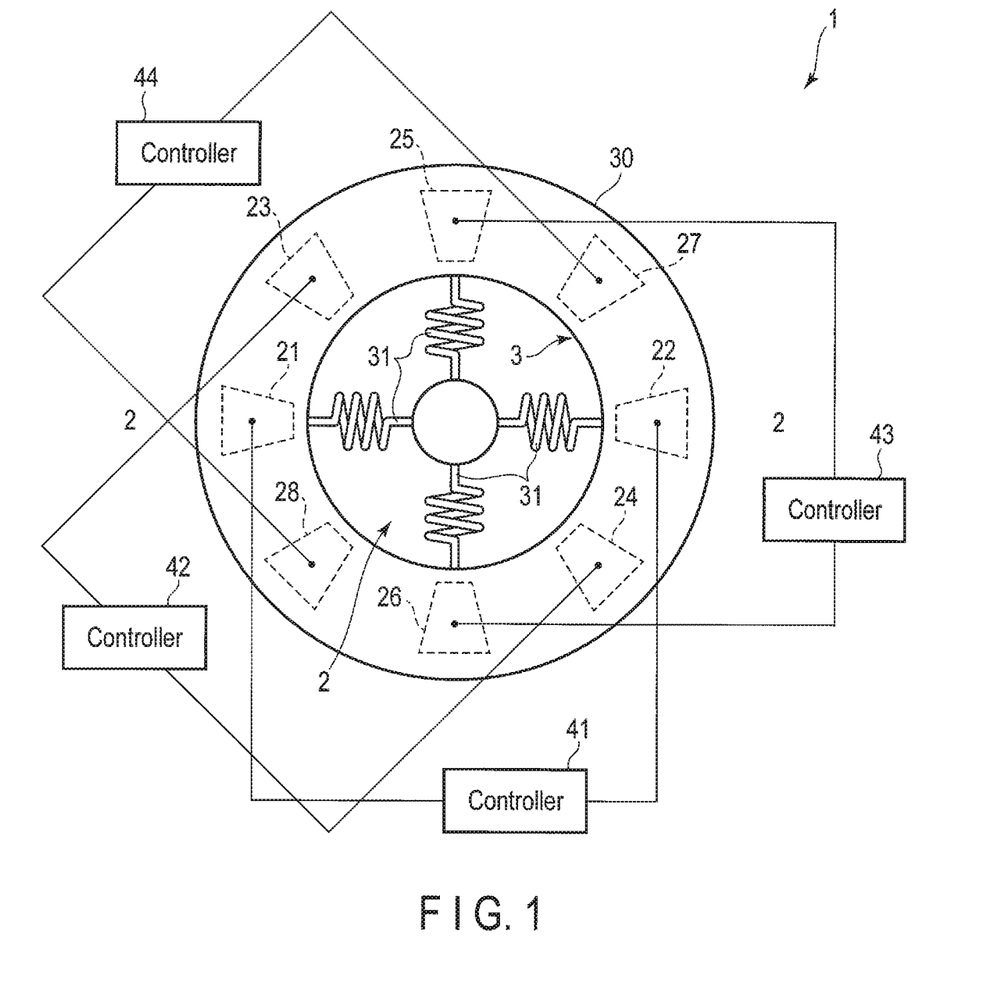
FIG. 1 is a plane view schematically depicting a resonator according to a first embodiment.
Figure 2:
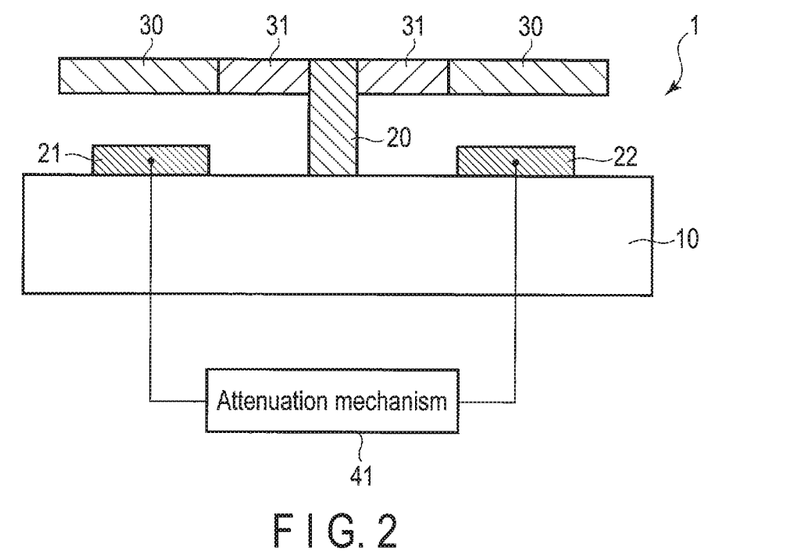
FIG. 2 is a sectional view taken along a line 2-2 of FIG. 1.

FIG. 1 is a plan view schematically depicting a resonator 1 according to a first embodiment. FIG. 2 is a sectional view taken along a line 2-2 of FIG. 1.

As shown in FIG. 2, the resonator 1 includes a substrate 10 and an anchor part 20. The substrate 10 includes a semiconductor substrate (not shown) and an insulating film (not shown) provided on the semiconductor substrate. The semiconductor substrate is, for example, a silicon substrate, and the insulating film is, for example, a silicon oxide film. The anchor part 20 is provided on the insulating film of the substrate 10.

The resonator 1 further includes a vibrator 30 having a disk shape and disposed above the substrate 10, and a spring part 31 connecting the vibrator 30 and the anchor part 20. Note that, m the plane view of FIG. 1, the spring part 31 is depicted as a spring shape, but in the cross-sectional view of FIG. 2, the spring portion 31 is depicted as a line for simplicity. Furthermore, in the cross-sectional views other than FIG. 2, the spring portions 31 are also depicted as lines for simplicity.

The vibrator 30 is disposed in a plane, and configured to vibrate in an in-plane translation mode (first mode) that is a main mode. The resonance frequency of the in-plane translation mode is, for example, at the order of 10 kHz.

The vibrator 30 has an opening 2. In FIG. 1, a reference symbol 3 denotes an inner wall that is provided to the vibrator 31 and defines the opening 2. When viewed from above the vibrator 30, the anchor part 20 is disposed in the opening 2. One end of the spring part 31 is connected to the inner wall 3 and the other end of the spring part 31 is connected to the anchor part 20.

Note that, the vibrator 30 has the disk shape in the present embodiment, but the vibrator 30 may have a different shape (e.g., quadrangle).

The resonator 1 further includes lower electrodes 21 to 28 provided on the substrate 10, a controller 41 connected to the lower electrodes 21 and 22, a controller 42 connected to the lower electrodes 23 and 24, a controller 43 connected to the lower electrodes 25 and 26, and a controller 44 connected to the lower electrodes 27 and 28. The lower electrodes 21 to 28 and controllers 41 to 44 have function to selectively attenuate vibration of a spurious mode that is mechanically coupled to the in-plane translation mode when the vibrator vibrates in the in-plane translation mode.

As shown FIG. 1, the lower electrodes 21 to 28 are disposed radially about the anchor part 20. The lower electrode (first electrode) 21 and the lower electrode (second electrode) 22 are disposed to face each other through the anchor part 20 when viewed from above the vibrator 30, and disposed below the vibrator 30. As a result, the lower electrode 21, the lower electrode 22, and the vibrator 30 form a pair of capacitors. Similarly, the lower electrode 23, the lower electrode 24, and the vibrator 30 form a pair of capacitors, the lower electrode 25, the lower electrode 26, and the vibrator 30 form a pair of capacitors, and the lower electrode 27, the lower electrode 28, and the vibrator 30 form a pair of capacitors. The number of lower electrodes is eight in the present embodiment, but the number is not particularly limited as long as the number is even.

Hereinafter, the capacitance between the lower electrode 21 and the vibrator 30 is referred to as capacitance C21, the capacitance between the lower electrode 22 and the vibrator 30 is referred to as capacitance C22, the capacitance between the lower electrode 23 and the vibrator 30 is referred to as capacitance C23, the capacitance between the lower electrode 24 and the vibrator 30 is referred to as capacitance C24, the capacitance between the lower electrode 25 and the vibrator 30 is referred to as capacitance C25, the capacitance between the lower electrode 26 and the vibrator 30 is referred to as capacitance C26, the capacitance between the lower electrode 27 and the vibrator 30 is referred to as capacitance C27, and the capacitance between the lower electrode 28 and the vibrator 30 is referred to as capacitance C28.

The controller 41 is configured to control a difference between value of the capacitance C21 and a value of the capacitance 21 such that the difference falls in a certain range. The controller 42 is configured to control a difference between value of the capacitance C23 and a value of the capacitance 24 such that the difference falls in the certain range. The controller 43 is configured to control a difference between value of the capacitance C25 and a value of the capacitance 26 such that the difference falls in the certain range. The controller 44 is configured to control a difference between value of the capacitance C27 and a value of the capacitance 28 such that the difference falls in a certain range. That is, the controllers 41 to 44 suppress the values of capacitance 21C to C28 from being changed.

When the vibrator vibrates in the in-plane translation mode and the spurious mode is not generated, vibration energy of the in-plane translation mode of vibrator 30 is not reduced, and thus the Q factor (quality factor) of the in-plane translation mode is not reduced. In this case, the values of capacitances C21 to C28 are the same. In the present embodiment, the spurious mode is an out-of-plane torsion mode.

Figure 3:
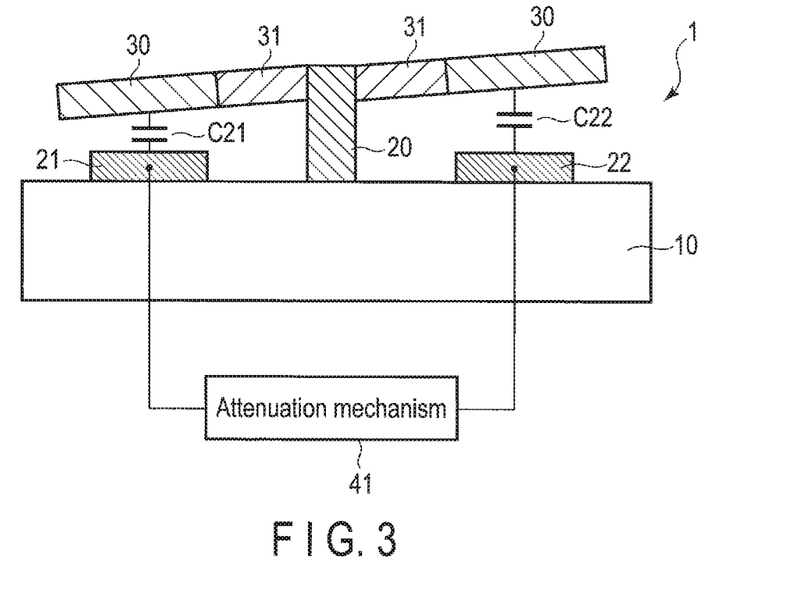
FIG. 3 is a diagram illustrating a capacitance change by out-of-plane torsion mode.

On the other hand, when the vibrator vibrates in the in-plane translation mode, and the out-of-plane torsion mode is generated and mechanically coupled with vibration energy of the in-plane translation mode, the energy of the in-plane translation mode is partially used for the vibration of the spurious mod, and thus the Q factor of the in-plane translation mode is reduced. In this case, there arises changes in values of capacitances C21 to C28. FIG. 3 illustrates an example in which the out-of-plane torsion mode is generated in the vibrator 30 shown in FIG. 2 and the value of the capacitance C21 is different from the value of the capacitance C22.

In the present embodiment, the changes of values of the capacitances C21 to C28 are suppressed by the controllers 41 to 44, and the vibration of the out-of-plane torsion mode mechanically coupled to the in-plane translation mode is selectively suppressed (attenuated). Consequently, the energy of the in-plane translation mode is suppressed from being partially used for the vibration of the spurious mod, and thus the Q factor of the in-plane translation mode is suppressed from being reduced.

The effectiveness of an attenuation mechanism according to the present embodiment will be described by using a model. When a displacement of the vibrator vibrating in the main mode is denoted by y, and the displacement of the vibrator vibrating in the spurious mode is denoted by y, and the coupling between the two can be expressed by the following equation of motion.

$$\begin{pmatrix} \ddot{x} \\ \ddot{y} \end{pmatrix} + \begin{pmatrix} b_1 \dot{x} \\ b_2 \dot{y} \end{pmatrix} + \begin{pmatrix} \omega_1^2 & \omega_q^2 \\ \omega_q^2 & \omega_2^2 \end{pmatrix} \begin{pmatrix} x \\ y \end{pmatrix} = 0.$$

Where $b_1$ and $b_2$ denote attenuation coefficients, $\omega_1$ and $\omega_2$ denote angular frequencies, and $\omega_q$ denotes the mechanical coupling between the main mode and the spurious mode.

Figure 4:
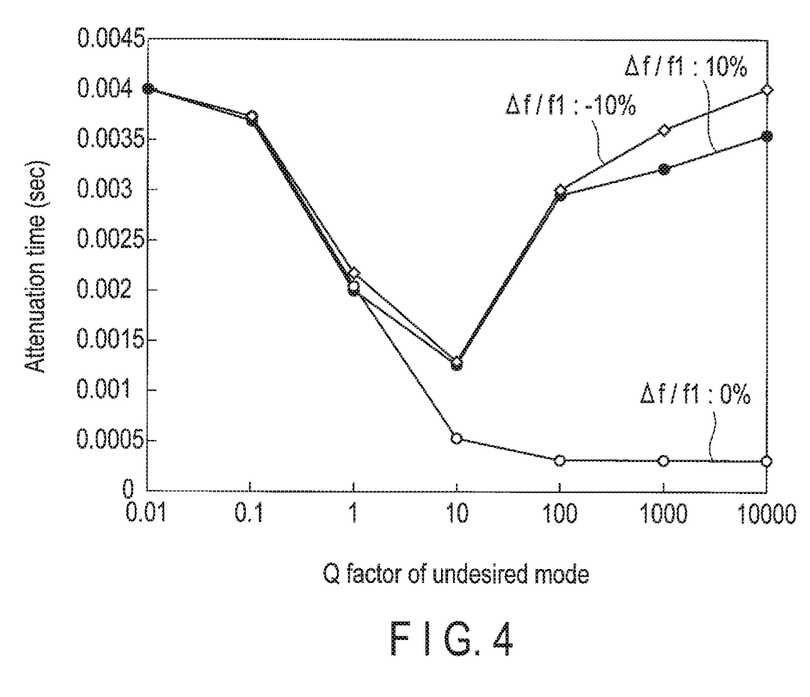
FIG. 4 is a graph illustrating how a loss of vibration energy of a first mode is influenced by Q factor of a spurious mode.

FIG. 4 is a graph illustrating how a loss of vibration energy of the main mode is influenced by Q factor of the spurious mode when the resonance frequency of the first mode is 20 kHz, the Q factor of the main mode is 10000, and $\omega_q/\omega_1=0.01$. The vertical axis represents time (attenuation time) that the energy of the vibrator attenuates down to 5%. The attenuation time is proportional to the Q factor of the main mode.

As seen from the FIG. 4, when the Q factor of the spurious mode is sufficiently small, without depending on $\Delta f$ (a parameter corresponding to a difference between the resonant frequency of the main mode and the resonant frequency of the spurious mod), that is, without increasing the $\Delta f$, the loss of the main mode is suppressed. The Q factor of the spurious mode needs to be an excessive attenuation state of at least Q<1, preferably Q<0.01. Note that, when the resonant frequency of the main modes is denoted by f1, and the resonant frequency of the spurious mode is dented by fs, the $\Delta f$ is represented by f1-fs.

As seen from the above analysis, when the Q factor of the spurious is reduced by the attenuation mechanism, the reduction of the Q factor of the main mode (reduction of vibrating energy) can be suppressed.

Incidentally, increasing $\Delta f$ is considered as another means for suppressing the reduction of the Q factor of the main mode. However, it is difficult to simultaneously increase the $\Delta f$ for each of the spurious modes. Eliminating the mechanical coupling ($\omega_q$) is considered as yet another means. However, the mechanical coupling is inevitably generated due to manufacturing variation, and is difficult to be completely eliminated.

In the present embodiment, the lower electrodes 21 to 28 disposed below the vibrator 30 are used, but upper electrodes disposed above the vibrator 30 may be used instead of the lower electrodes 21 to 28.

Figure 5:
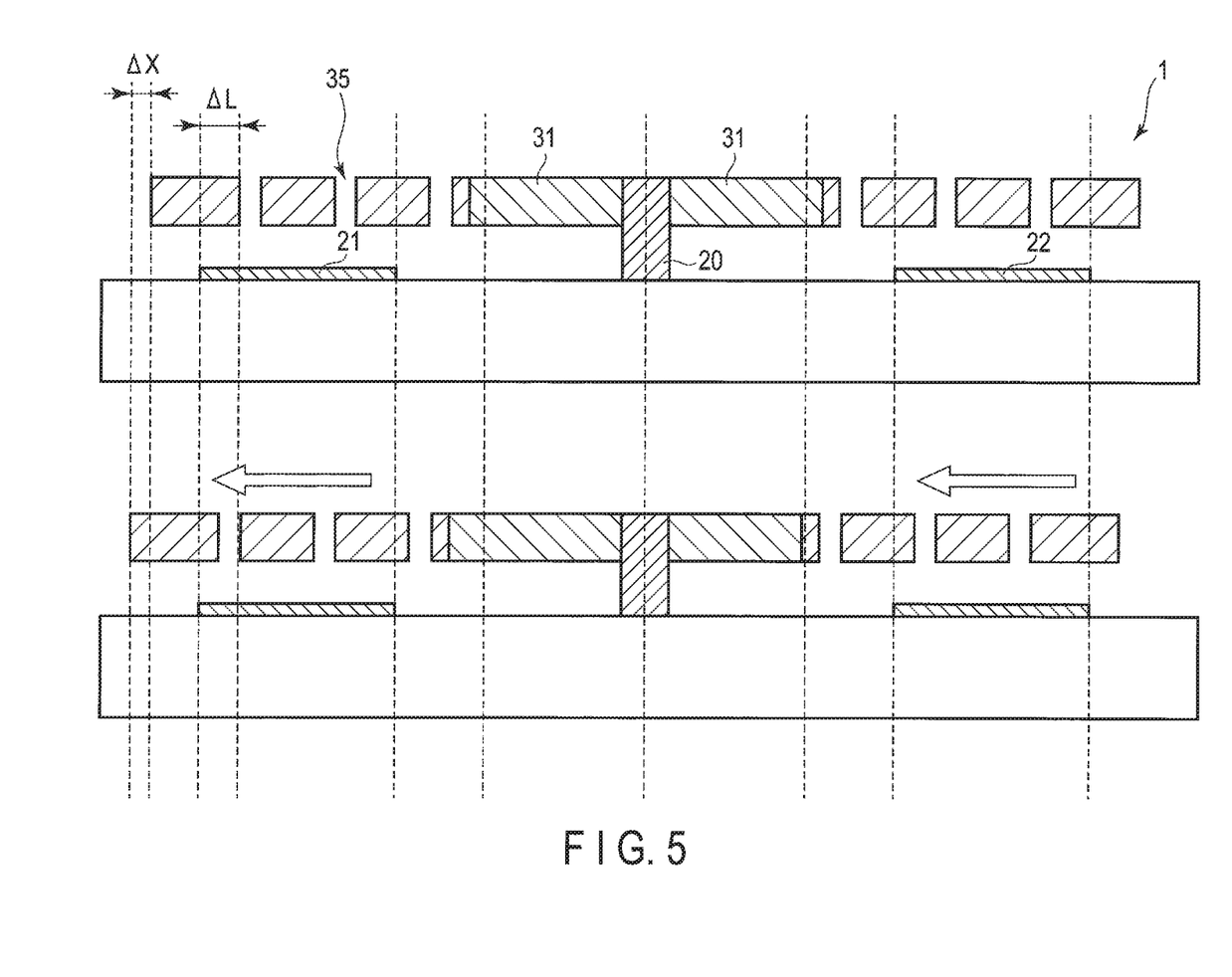
FIG. 5 is a diagram for explaining a method for suppressing reduction of Q factor of an in-plane translation mode.

When the resonator 1 is manufactured by using process that employs a sacrifice film, as shown in FIG. 5, the vibrator 30 has a through hole 35. In this case, it is preferable to suppress the reduction of Q factor of the in-plane translation mode by suppressing a change of overlap areas between the vibrator 30 and the lower electrode 21 during the vibration of the in-plane translation mode (translational motion). To achieve this, the resonator 1 is designed to be $\Delta x<\Delta L$, where $\Delta x$ is a displacement of amplitude of the translational motion, $\Delta L$ is a distance from an edge of the through hole 35 to an edge of the lower electrode 21. Similarly, a change of overlap areas between the vibrator 30 and the lower electrode 22 is to be suppressed.

Second Embodiment

Figure 6:
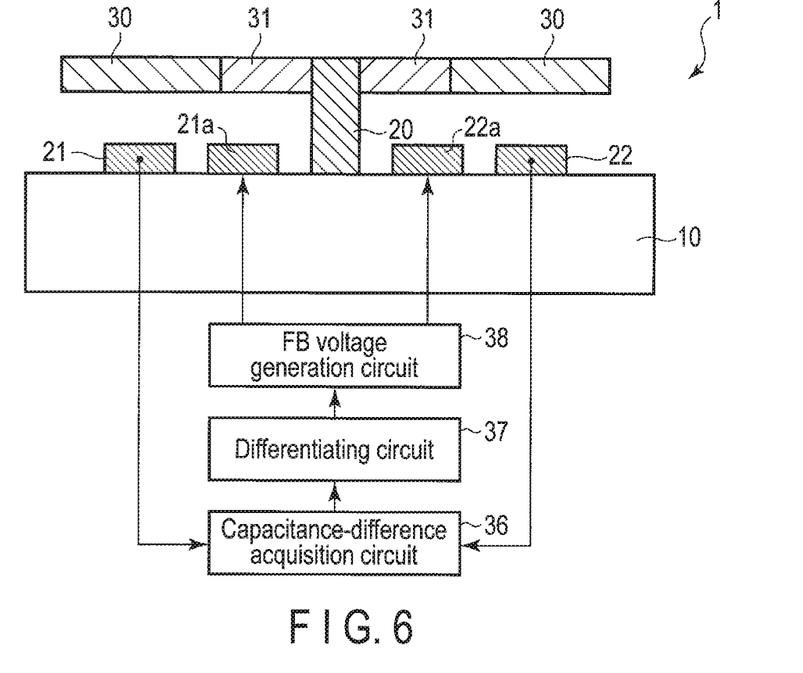
FIG. 6 is a sectional view schematically depicting a resonator according to a second embodiment.

FIG. 6 is a sectional view schematically depicting a resonator according to a second embodiment. FIG. 6 corresponds to the sectional view of FIG. 2 of the first embodiment.

In the present embodiment, the resonator 1 employing an active type (feedback type) attenuation mechanism will be described. The spurious mode is an cut-of-plane torsion mode.

The attenuation mechanism of the present embodiment includes a lower electrode 21, a lower electrode 21a, a lower electrode 22, and a lower electrode 22a that are provided on a substrate 10. The lower electrode 21a is disposed a side where the lower electrode 21 is provided. The lower electrode 22a is disposed on a side where the lower electrode 22 is provided. When viewed from above the substrate 10, the lower electrode 22a is disposed to face the lower electrode 21a through an anchor part 20. The attenuation mechanism further includes a capacitance-difference acquisition circuit 36, a differentiating circuit 37, and a feedback (FB) voltage generation circuit 38.

The capacitance-difference acquisition circuit 36 is connected to the lower electrode 21 and the lower electrode 22. The capacitance-difference acquisition circuit 36 measures a value of the capacitance C21 and a value of capacitance C22, and acquires the difference of the values (capacitance difference). The capacitance difference is acquired by, for example, subtracting the measured value of the capacitance C22 from the measured value of capacitance C21. The capacitance difference is not necessarily a constant, rather the capacitance difference changes as time goes on when the out-of-plane torsion mode is generated and is mechanically coupled to the in-plane translation mode. The capacitance-difference acquisition circuit 36 outputs a signal (first output signal) corresponding to the capacitance difference.

The differentiating circuit 37 differentiates the first output signal (temporal differentiation). The differentiating circuit 37 outputs a signal, (second output signal) corresponding to a derivative function of the first output signal. The Q factor of the spurious mode can be adjusted by the differentiating circuit 37.

The FE voltage generation circuit 38 generates a control voltage that is to be applied between the lower electrode 21a and the lower electrode 22a, based on the second output signal. The control voltage is a feedback signal to cause the difference between the capacitance C21 and the capacitance C22 falls in a certain range.

Third Embodiment

Figure 7:
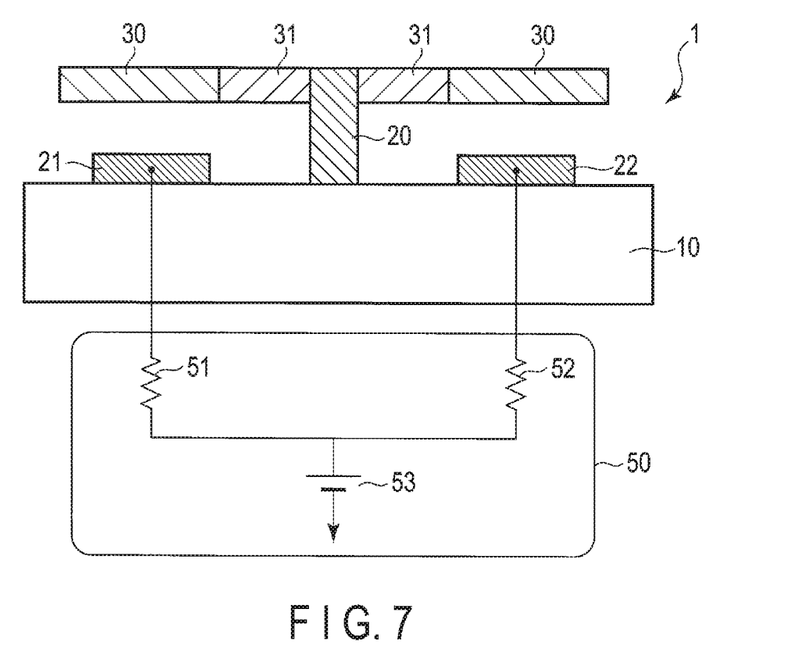
FIG. 7 is a sectional view schematically depicting a resonator according to a third embodiment.

FIG. 7 is a sectional view schematically depicting a resonator according to a third embodiment. FIG. 7 corresponds to the sectional view of FIG. 2 according to the first embodiment.

In the present embodiment, the resonator 1 employing a passive attenuation mechanism will be described. The spurious mode is an out-of-plane torsion mode.

The attenuation mechanism of the present embodiment includes a lower electrode 21 and a lower electrode 22 that are provided on a substrate 10, and a damper circuit 50 connected to the lower electrode 21 and the lower electrode 22.

The damper circuit 50 includes a first resistive element 51, a second resistive element 52, and a power source 53. One end of the first resistive element 51 is connected to the lower electrode 21, and another end of the first resistive element 51 is connected to the power source 53. One end of the second resistive element 52 is connected to the lower electrode 22, and another end of the second resistive element 52 is connected to the power source 53.

In response to change of the value of the capacitance C21, electric charge corresponding to the change is generated on the lower electrode 21, and then the electric charge follows through the first resistive element 51 and are converted into thermal energy. As a result, the value of the capacitance C21 returns to approximately the same original vale before the change. On the other hand, in response to change of the value of the capacitance C22, electric charge corresponding to the change is generated on the lower electrode 22, and then the electric charge follows through the second resistive element 52 and are converted into thermal energy. As a result, the value of the capacitance C22 returns to approximately the same original vale before the change. Therefore, even though the out-of-plane torsion mode is mechanically coupled to the in-plane translation mode and the difference between the capacitance C21 and the capacitance C22 is generated, the value of the capacitance C21 and the value of the capacitance C22 each return to approximately the same original vale before the change. Thereby enabling suppression (attenuation) of the vibration of the out-of-plane torsion, and thus the reduction of the Q factor of the in-plane translation mode due to the coupling with the out-of-plane torsion mode is reduced.

Fourth Embodiment

Figure 8:
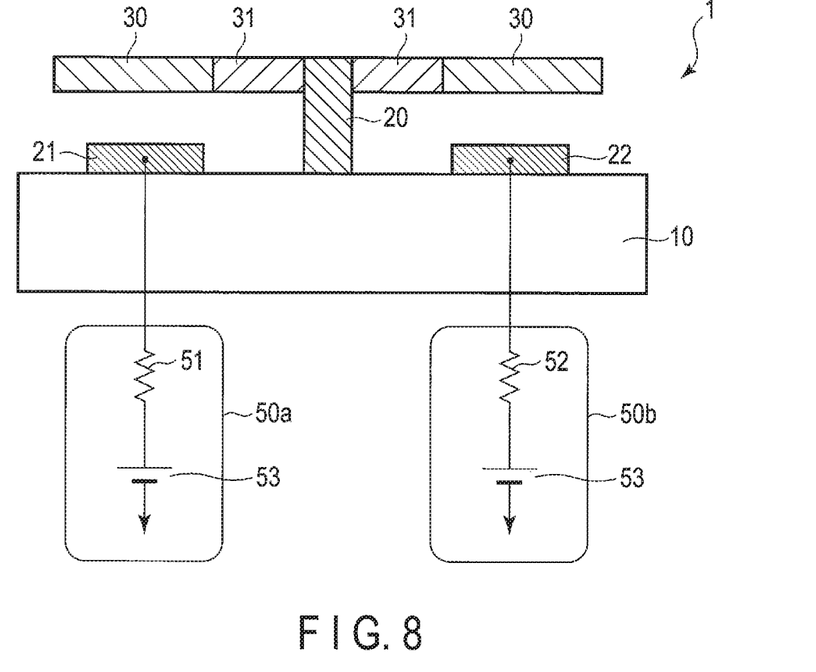
FIG. 8 is a sectional view schematically depicting a resonator according to a fourth embodiment.

FIG. 8 is a sectional view schematically depicting a resonator according to a fourth embodiment. FIG. 8 corresponds to the sectional view of FIG. 2 of the first embodiment.

In the present embodiment, the resonator 1 employing a passive attenuation mechanism will be described. The spurious mode is an out-of-plane torsion mode.

The present embodiment is different from the third embodiment in that each lower electrode is provided with a damper circuit. FIG. 8 illustrates a damper circuit 50a provided at a lower electrode 21 and a damper circuit 50b provided at a lower electrode 22. The damper circuit 50a includes a first resistive element 51 and a power source 53. One end of the first resistive element 51 is connected to the lower electrode 21, and another end of the first resistive element 51 is connected to the power source 53. The damper circuit 50b includes a second resistive element 52 and a power source 53. One end of the second resistive element 52 is connected to the lower electrode 22, and the other end of the second resistive element 52 is connected to the power source 53. The present embodiment provides an advantage that is similar to that of the third embodiment.

Fifth Embodiment

Figure 9:
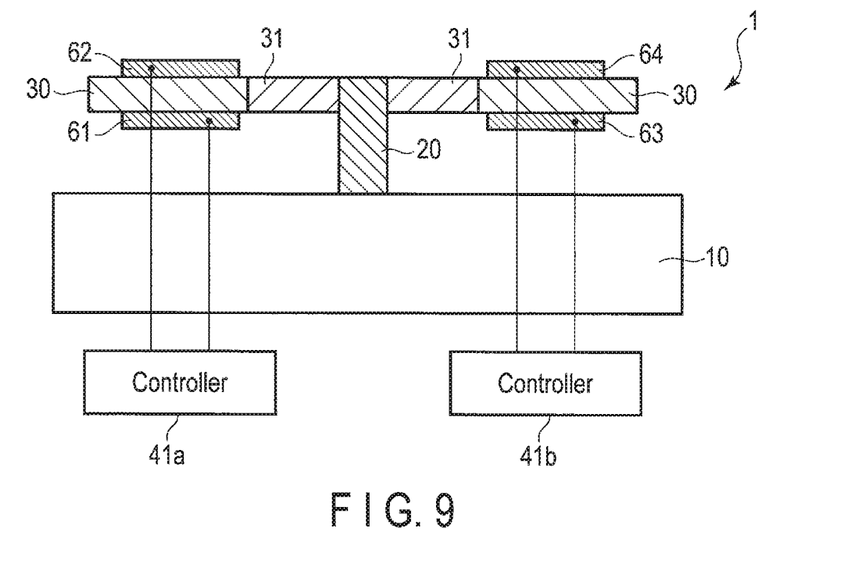
FIG. 9 is a sectional view schematically depicting a resonator according to a fifth embodiment.

FIG. 9 is a sectional view schematically depicting a resonator according to a fifth embodiment. FIG. 9 corresponds to the sectional view of FIG. 2 of the first embodiment.

In the present, embodiment, the resonator 1 employing an attenuation mechanism including piezoelectric films instead of the lower electrodes will be described. The spurious mode is an out-of-plane torsion mode.

The attenuation mechanism of the present embodiment includes a first piezoelectric film 61, a second piezoelectric film 62, a third piezoelectric film 63, a fourth piezoelectric film 64, a first controller 41a, and a second controller 41b.

The first piezoelectric film 61 is provided on the lower surface of a vibrator 30. The second piezoelectric film 62 is provided on the upper surface of the vibrator 30 and disposed to face the first piezoelectric film 61. The third piezoelectric film 63 is provided on the lower surface of the vibrator 30 and disposed to face the first piezoelectric film 61 through an anchor part 20. The fourth piezoelectric film 64 is provided on the upper surface of the vibrator 30 and disposed to face the third piezoelectric film 63.

The first controller 41a is connected to the first piezoelectric film 61 and the second piezoelectric film 62. The second controller 41b is connected to the third piezoelectric film 63 and the fourth piezoelectric film 64.

When the out-of-plane torsion mode is generated and mechanically coupled to the in-plane translation mode, torsion is generated in each of the first to fourth piezoelectric films 61 to 64, and thus electric charge is generated in each of the first to fourth piezoelectric films 61 to 64. Such a generation of the electric charge causes a potential difference between the first piezoelectric film 61 and the second piezoelectric film 62 (first potential difference), and a potential difference between the third piezoelectric film 63 and the fourth piezoelectric film 64 (second potential difference).

The first controller 41a controls the charge generated in the first piezoelectric film 61 and the second piezoelectric film 61 such that the first potential difference falls in a certain range. The second controller 41b controls the charge generated in the third piezoelectric film 63 and the fourth piezoelectric film 64 such that the second potential difference falls in a certain range.

For example, the damper circuit 40 shown in FIG. 8 may be used for the respective first and second controllers 41a and 41b. In this case, the charge generated in the first to fourth piezoelectric films 61 to 64 escapes through the damper circuits 40 and are potential difference and the second potential difference reduce to nearly zero. Thereby suppressing reduction of the Q factor of the in-plane translation mode due to the coupling with the out-of-plane torsion mode.

Sixth Embodiment

Figure 10:
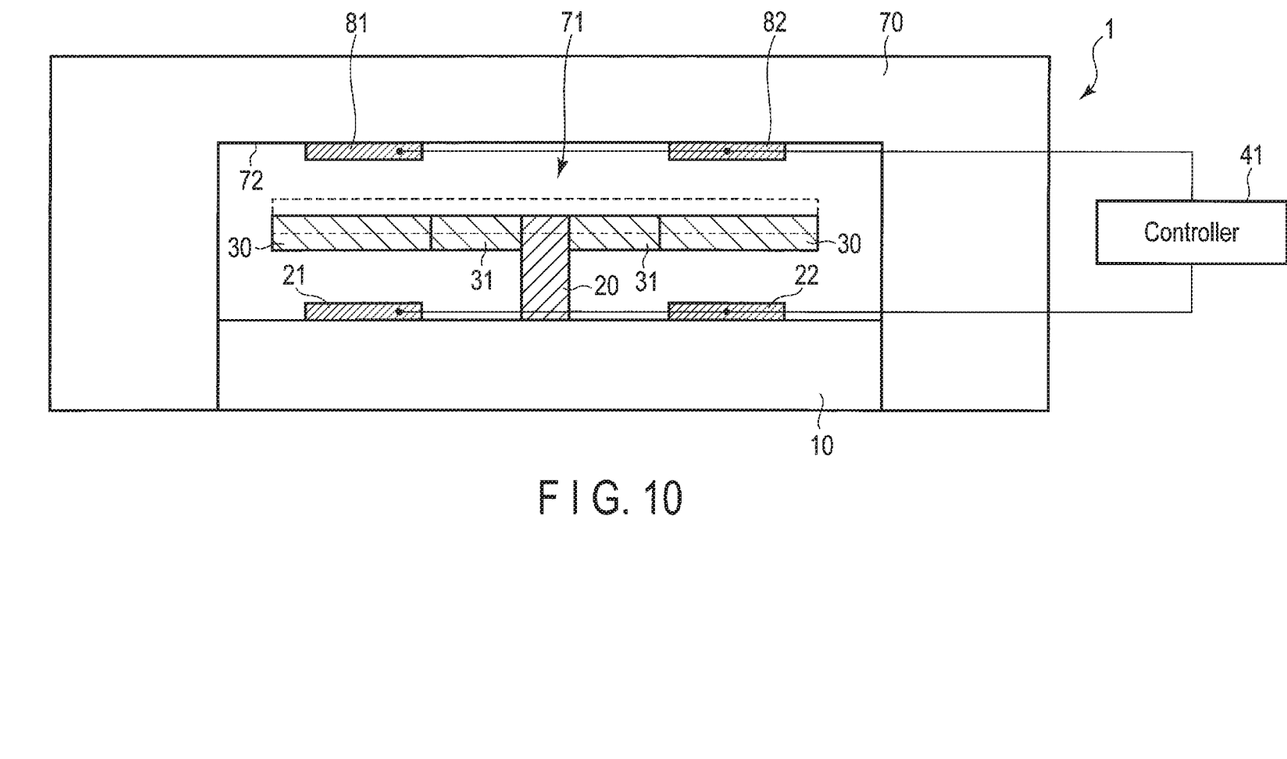
FIG. 10 is a sectional view schematically depicting a resonator according to a sixth embodiment.

FIG. 10 is a sectional view schematically depicting a resonator according to a sixth embodiment. FIG. 10 corresponds to the sectional view of FIG. 2 of the first embodiment.

In the present embodiment, a case where a spurious mode is an out-of-plane translation mode will be described. In FIG. 9, a reference symbol 70 denotes a lid that seals the resonator 1. The lid 70 and the substrate 10 constitute a cavity 71 in which the resonator 1 can operate.

A first upper electrode 81 and a second upper electrode 82 are provided on the upper wall 72 of the cavity 71. The first upper electrode 81 is disposed to face a lower electrode 21 through a vibrator 30. The second upper electrode 82 is disposed to face a lower electrode 22 through the vibrator 30. The lower electrode 21, the lower electrode 22, the first upper electrode 81, and the second upper electrode 82 are connected to a controller 41.

In the case of the out-of-plane translation mode, the vibrator 30 displaces upward as shown by a broken line. When the vibrator 30 displaces in that manner, a capacitance (first capacitance) between the lower electrode 21 and the vibrator 30 differs from a capacitance (second capacitance) between the upper electrode 81 and the vibrator 30. Similarly, a capacitance (third capacitance) between the lower electrode 22 and the vibrator 30 differs from a capacitance (fourth capacitance) between the upper electrode 82 and the vibrator 30.

The controller 41 controls the first capacitance and the second capacitance such that the difference between the first capacitance and the second capacitance falls in a certain range, and the controller 41 further controls the third capacitance and the fourth capacitance such that the difference between the third capacitance and fourth capacitance falls in a certain range. Thereby the following advantage is obtained. Even the out-of-plane translation mode is generated and coupled to an in-plane translation mode while the vibrator 30 vibrates in the in-plane translation mode, the vibration of the out-of-plane translation mode can be reduced, so that the reduction of the value of the Q-mode of the in-plane translation mode due to the coupling with the out-of-plane translation mode is suppressed.

Seventh Embodiment

Figure 11:
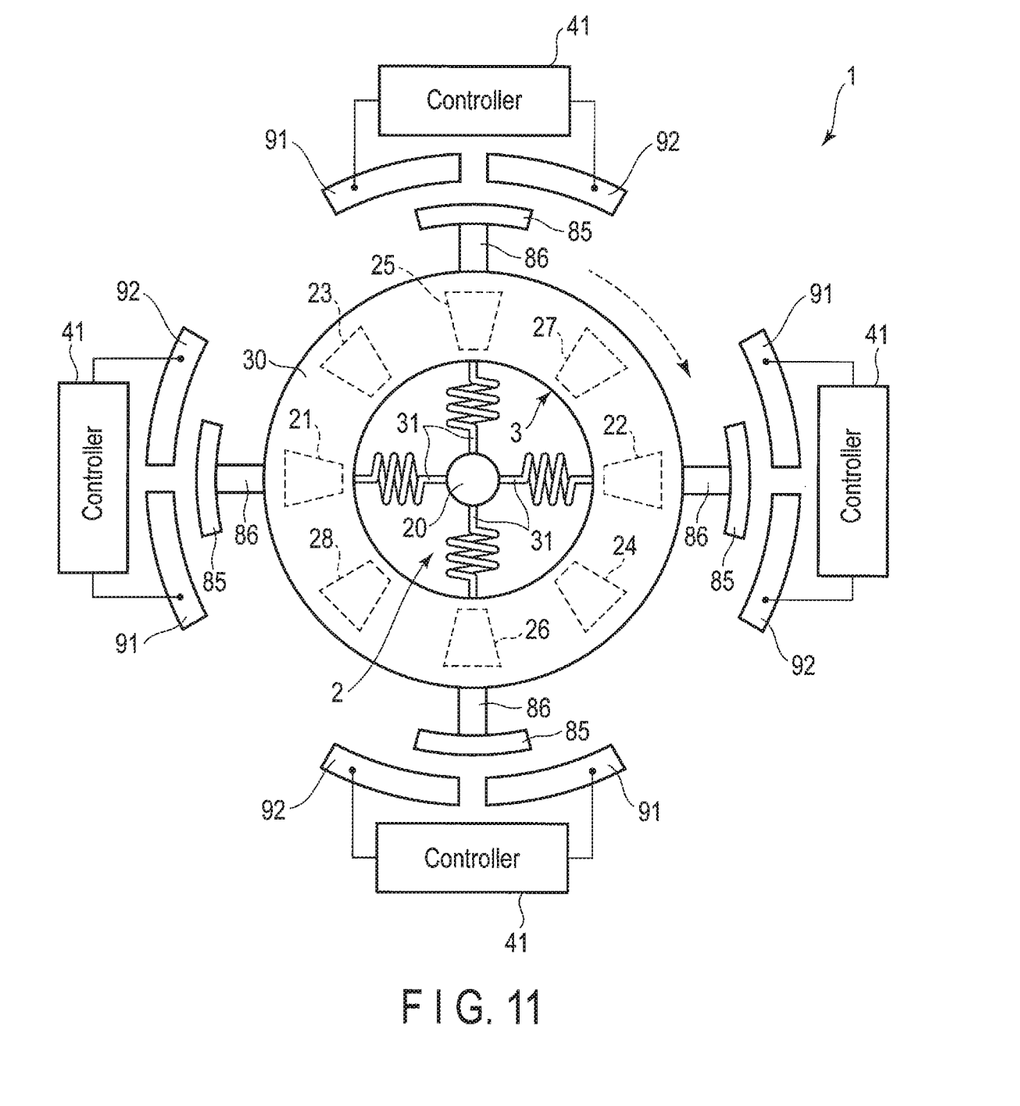
FIG. 11 is a plan view schematically depicting a resonator according to a seventh embodiment.

FIG. 11 is a plan view schematically depicting a resonator according to a seventh embodiment.

In the present embodiment, a case where a spurious mode is an in-plane rotation mode will be described. In FIG. 11, a reference symbol 85 denotes an outer circumferential electrode 83 that is disposed away from the vibrator 30 and disposed along a part of the outer circumference of the vibrator 30. In FIG. 11, the number of outer circumferential electrodes 85 is four, but the number is not limited to four. The outer circumferential electrode 85 is connected to the vibrator 30 by a connecting electrode 86.

A first electrode 91 is provided outside the outer circumferential electrode 85 to face a part of the outer circumferential electrode 85. Furthermore, a second electrode 92 is provided outside the outer circumferential electrode 85 to face a part of the outer circumferential electrode 85.

When an out-of-plane translation mode is absent, a capacitance between the circumferential electrode 85 and the first electrode 91 (first capacitance) is the same as a capacitance between the circumferential electrode 85 and the second electrode 92 (second capacitance). In contrast, the out-of-plane translation mode is generated, the vibrator 30 rotates in a certain angular range, as shown by the broken line. When the vibrator 30 rotations in such a way, the first capacitance and the second capacitance change.

A controller 41 controls the first capacitance and the second capacitance such that the difference between the first capacitance and the second capacitance remains in a certain range. Thereby the following advantage is obtained. Even the in-plane rotation mode is generated and coupled to the in-plane translation mode while the vibrator 30 vibrates in the in-plane translation mode, the vibration of the in-plane rotation mode can be reduced, so that the reduction of the value of the Q-mode of the in-plane translation mode due to the coupling with in-plane rotation mode is suppressed.

Eighth Embodiment

Figure 12:
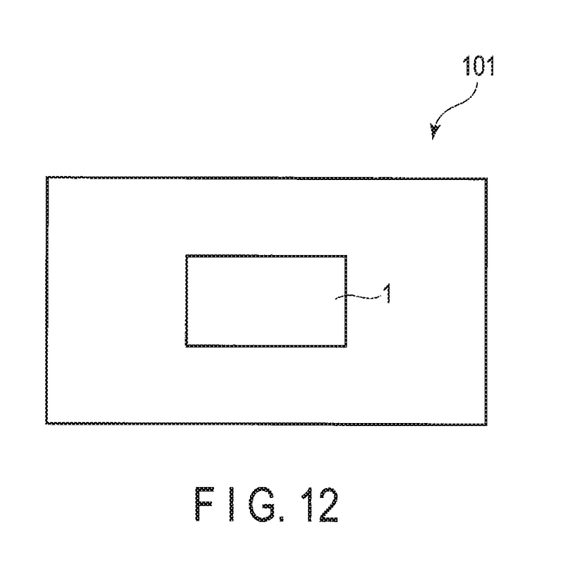
FIG. 12 is a block diagram depicting a device according to an eighth embodiment.

FIG. 12 is a block diagram depicting a device according to an eighth embodiment.

The device 101 includes the resonator 1 according to any of the first to seventh embodiments. The resonator 1 is higher in precision than a resonator including quartz. Thus, the resonator 1 is applicable to various devices (electronic equipment and electrical equipment). Examples of the device 101 include a clock circuit that generates a reference clock for an IC, a device including the clock circuit, and a gyroscope.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may made without departing from the spirit of the inventions. The accompanying claims and their equivalents are intended to cover such forms or modifications as would fall within the scope and spirit of the inventions.

What is claimed is:

1. A resonator comprising:
   a substrate;
   an anchor part provided on the substrate;
   a spring part;
   a vibrator disposed above the substrate and connected to the anchor part through the spring part; and
   an attenuation mechanism configured to selectively attenuate vibration of a spurious mode that is mechanically coupled to a first mode when the vibrator vibrates in the first mode,
   wherein:
   the vibrator has an opening,
   the anchor part is disposed in the opening when viewed from above the vibrator,
   one end of the spring part is connected to an inner wall that defines the opening, another end of the spring part is connected to the anchor part, and
   the attenuation mechanism comprises:
      a first electrode provided on the substrate;
      a second electrode provided on the substrate and disposed to face the first electrode through the anchor part; and
      a controller configured to control a first capacitance between the vibrator and the first electrode and a second capacitance between the vibrator and the second electrode such that a difference between the first capacitance and the second capacitance falls in a certain range.

2. The resonator according to claim 1, wherein:
   the attenuation mechanism further comprises
      a third electrode provided on the substrate and disposed on a side where the first electrode is provided; and
      a fourth electrode provided on the substrate, disposed on a side where the second electrode is provided, and facing the third electrode through the anchor part, and
   the controller comprises
      an acquisition circuit configured to acquire the difference between the first capacitance and the second capacitance;
      a differentiating circuit configured to differentiate a first output signal from the acquisition circuit; and
      a voltage generation circuit configured to generate a control voltage based on a second output voltage from the acquisition circuit, the control voltage being to be applied between the third electrode and the fourth electrode to cause the difference between the first capacitance and the second capacitance falls in the certain range.

3. The resonator according to claim 1, wherein the controller comprises a damper circuit connected to the first electrode and the second electrode.

4. The resonator according to claim 1,
   wherein the attenuation mechanism comprises:
      a first damper circuit connected to the first electrode; and
      a second damper circuit connected to the second electrode.

5. The resonator according to claim 1, wherein the attenuation mechanism is configured to reduce a Q factor of the spurious mode to one or less.

6. The resonator according to claim 1, wherein the vibrator has a disk shape.

7. The resonator according to claim 1, wherein the first mode includes an in-plane translation mode.

8. The resonator according to claim 7, wherein the spurious mode includes an out-of-plane torsion mode, out-of-plane translation mode, or in-plane rotation mode.

9. A resonator comprising:
   a substrate;
   an anchor part provided on the substrate;
   a spring part;
   a vibrator disposed above the substrate and connected to the anchor part through the spring part; and
   an attenuation mechanism configured to selectively attenuate vibration of a spurious mode that is mechanically coupled to a first mode when the vibrator vibrates in the first mode,
   wherein the attenuation mechanism comprises:
      a first piezoelectric film provided on a lower surface of the vibrator;
      a second piezoelectric film provided on an upper surface of the vibrator and facing the first piezoelectric film;
      a third piezoelectric film provided on the lower surface of the vibrator and disposed to face the first piezoelectric film through the anchor part;
      a fourth piezoelectric film provided on the upper surface of the vibrator and facing the third piezoelectric film; and
      a controller configured to control a first potential difference between the first piezoelectric film and the second piezoelectric film and a second potential difference between the third piezoelectric film and the fourth piezoelectric film such that a difference between the first potential difference and the second potential difference falls in a certain rage.

10. The resonator according to claim 9, wherein the attenuation mechanism is configured to reduce a Q factor of the spurious mode to one or less.

11. The resonator according to claim 9, wherein the vibrator has a disk shape.

12. The resonator according to claim 9, wherein the first mode includes an in-plane translation mode.

13. The resonator according to claim 12, wherein the spurious mode includes an out-of-plane torsion mode, out-of-plane translation mode, or in-plane rotation mode.

14. A resonator comprising:
   a substrate;
   an anchor part provided on the substrate;
   a spring part;
   a vibrator disposed above the substrate and connected to the anchor part through the spring part; and
   an attenuation mechanism configured to selectively attenuate vibration of a spurious mode that is mechanically coupled to a first mode when the vibrator vibrates in the first mode,
   wherein:
   the vibrator has an opening, the anchor part is disposed in the opening when viewed from above the vibrator, one end of the spring part is connected to an inner wall that defines the opening, another end of the spring part is connected to the anchor part, and the attenuation mechanism comprises:
- a first lower electrode provided on the substrate;
- a second lower electrode provided on the substrate and facing the first lower electrode through the anchor part;
- a first upper electrode disposed above the vibrator and facing the first lower electrode;
- a second upper electrode disposed above the vibrator to face the second lower electrode; and
- a controller configured to control a first capacitance between the first lower electrode and the vibrator and a second capacitance between the first upper electrode and the vibrator, a third capacitance between the second lower electrode and the vibrator, and a fourth capacitance between the second upper electrode and the vibrator such that a difference between the first capacitance and the second capacitance falls in a certain range and a difference between the third capacitance and the fourth capacitance falls in a certain range.

15. The resonator according to claim 14, wherein the attenuation mechanism is configured to reduce a Q factor of the spurious mode to one or less.

16. The resonator according to claim 15, wherein the first mode includes an in-plane translation mode.

17. The resonator according to claim 16, wherein the spurious mode includes an out-of-plane torsion mode, out-of-plane translation mode, or in-plane rotation mode.

18. The resonator according to claim 14, wherein the vibrator has a disk shape.

19. A resonator comprising:
a substrate;
an anchor part provided on the substrate;
a spring part;
a vibrator disposed above the substrate and connected to the anchor part through the spring part; and
an attenuation mechanism configured to selectively attenuate vibration of a spurious mode that is mechanically coupled to a first mode when the vibrator vibrates in the first mode, wherein:
the vibrator has an opening,
the anchor part is disposed in the opening when viewed from above the vibrator,
one end of the spring part is connected to an inner wall that defines the opening, another end of the spring part is connected to the anchor part, and
the attenuation mechanism comprises:
- an outer circumferential electrode disposed away from the vibrator and disposed along a portion of an outer circumference of the vibrator when viewed from above the vibrator, and the outer circumferential electrode being electrically connected to the vibrator;
- a first electrode facing a portion of the outer circumferential electrode;
- a second electrode facing a portion of the outer circumferential electrode; and
- a controller configured to control a first capacitance between the first electrode and the outer circumferential electrode and a second capacitance between the second electrode and the outer circumferential electrode such that a difference between the first capacitance and the second capacitance falls in a certain range.

20. The resonator according to claim 19, further comprising a connecting electrode configured to connect the outer circumferential electrode and the vibrator.

* * * * *